(12) United States Patent
Benyahia et al.

(10) Patent No.: US 8,035,437 B2
(45) Date of Patent: Oct. 11, 2011

(54) PHASE INTERPOLATOR

(75) Inventors: Mohamed Benyahia, C.Y.M. Rabat (MA); Lionel Vogt, Saint Martin d'Heres (FR)

(73) Assignee: STMicroelectronics Maroc, Casablanca (MA)

( * ) Notice: Subject to any disclaimer, the term of this patent is extended or adjusted under 35 U.S.C. 154(b) by 0 days.

(21) Appl. No.: 12/624,698

(22) Filed: Nov. 24, 2009

(65) Prior Publication Data

US 2010/0134152 A1 Jun. 3, 2010

(30) Foreign Application Priority Data

Nov. 28, 2008 (FR) ...................................... 08 58112

(51) Int. Cl.
*H03H 11/16* (2006.01)
(52) U.S. Cl. ........................................ 327/231; 327/237
(58) Field of Classification Search ........................ None
See application file for complete search history.

(56) References Cited

U.S. PATENT DOCUMENTS

| | | | | |
|---|---|---|---|---|
| 5,999,793 A | * | 12/1999 | Ben-Efraim et al. | ............ 725/68 |
| 2004/0057546 A1 | * | 3/2004 | Badets et al. | ................ 375/371 |
| 2010/0134158 A1 | | 6/2010 | Pignol et al. | |

FOREIGN PATENT DOCUMENTS

FR 2 914 807 A 10/2008

OTHER PUBLICATIONS

Dally W.J. et al., *A second-Order Semidigital Clock Recovery circuit Based on Injection Locking*, IEEE Journal of Solid-State Circuits, IEEE Service Center, Piscataway, NJ, vol. 38, No. 12, Dec. 1, 2003, pp. 2101-2110, XP011104260.
Preliminary Search Report for French Patent Application FR 08/58112 dated Jun. 24, 2009.

* cited by examiner

*Primary Examiner* — Cassandra Cox
(74) *Attorney, Agent, or Firm* — Lisa K. Jorgenson; Wolf, Greenfield & Sacks, P.C.; James H. Morris (57) ABSTRACT

A phase interpolator receiving a first signal having an oscillation frequency Fin and providing a second signal having said oscillation frequency and having a phase shift Δφ with respect to the first signal which depends on a third signal. The interpolator includes a variable phase-shifter receiving the first signal and providing the second signal, the phase-shifter circuit includes an oscillator having a variable natural frequency Fo controlled by a fourth signal; a phase comparator capable of receiving the first and second signals and of providing a fifth signal representative of said phase shift; and a unit capable of providing the fourth signal which depends on the third and fifth signals.

38 Claims, 5 Drawing Sheets

PHASE INTERPOLATOR

CROSS REFERENCE TO RELATED APPLICATIONS

This application claims the priority benefit of French patent application Ser. No. 08/58112, filed on Nov. 28, 2008, entitled "PHASE INTERPOLATOR," which is hereby incorporated by reference to the maximum extent allowable by law.

BACKGROUND OF THE INVENTION

1. Field of the Invention

The present invention relates a phase interpolator, and especially a digitally-controlled phase interpolator.

2. Discussion of the Related Art

Phase interpolators find applications, in particular, in the field of digital frequency synthesis.

There mainly exist two types of phase interpolators. A phase interpolator of the first type receives two phase-shifted initial signals having the same waveform and provides, by phase interpolation of the initial signals, a signal having a waveform similar to the initial signals and having a phase ranging between the phases of the two initial signals. A phase interpolator of the first type thus requires, for each signal to be provided, two initial signals such that the signal to be provided has a phase interposed between those of the initial signals, so that the interpolation operation can be performed. It is thus necessary to have many initial signals. Thereby, such a phase interpolator generally has a complex structure, takes up a significant surface area when made in integrated form, and has a high power consumption.

A phase interpolator of the second type implements delay elements. The delay elements may be so-called simple delay elements, for example, inverters. The operation of a simple delay element is based on the propagation time of a signal between the input and the output of the delay element. This time generally depends on parameters such as the capacitance or the supply current of the delay element. A phase interpolator with simple delay elements is generally highly sensitive to the initial noise and has operating characteristics which depend on the interpolator manufacturing process and on temperature. It is further difficult to form a phase interpolator with simple delay elements which is digitally-controlled. The delay elements may be formed from synchronized oscillators. An example of a phase interpolator comprising synchronized oscillators is described in French patent application 2841406 filed by STMicroelectronics. Such an interpolator advantageously enables avoiding adding noise to the phase of the supplied signal. However, currently-available synchronized oscillator phase interpolators generally have a complex structure, especially due to the use of a large number of synchronized oscillators.

SUMMARY OF THE INVENTION

At least one embodiment of the present invention aims at a phase interpolator comprising a synchronized oscillator and having a simple structure.

According to another object, the phase interpolator may be controlled in a simple way by a digital signal.

According to another object, the consumption of the phase interpolator is decreased.

To achieve all or part of these objects as well as others, at least one embodiment of the present invention provides a phase interpolator receiving a first signal having an oscillation frequency and providing a second signal having said oscillation frequency and being phase-shifted, the interpolator comprising a variable phase-shifter circuit receiving the first signal and providing the second signal, the phase-shifter circuit comprising an oscillator having a variable natural frequency controlled by a fourth signal; a phase comparator capable of receiving the first and second signals and of providing a fifth signal representative of said phase shift; and a unit capable of providing the fourth signal, which depends on the third and fifth signals.

According to an embodiment of the present invention, the phase-shifter comprising an astable multivibrator circuit having a first branch and a second branch arranged in parallel between first and second supply terminals, means capable of providing, in each of the first and second branches, a first current controlled by the fourth signal, which results in a variation of the free oscillation frequency of the synchronized oscillator.

According to an embodiment of the present invention, for each of the first and second branches, the means comprise a first current source capable of providing a second constant current, and the fourth signal is a third variable current which adds to the second current.

According to an embodiment of the present invention, the phase comparator is capable of providing the fifth signal in the form of a binary signal having a duty cycle which depends on said phase shift $\Delta\phi$.

According to an embodiment of the present invention, the first and second signals are binary signals alternating between first and second states and the phase comparator is capable of providing the fifth signal in a third state when, the first signal having a phase lead over the second signal, the first signal is in the first state, the second signal being in the second state, and of providing the fifth signal substantially in a fourth state otherwise.

According to an embodiment of the present invention, the third signal is a digital signal coded over a number M of bits, a number N of said M bits being in a third state, and the unit comprises: a capacitor; a second current source capable of delivering a fourth constant current IUP; M third current sources, each third current source being capable of delivering a fifth constant current ID; and a connection circuit capable of connecting the second and third current sources to the capacitor to charge the capacitor with a sixth current equal to IUP−N*ID when the fifth signal is in the third state and, at least partly, equal to −N*ID when the fifth signal is in the fourth state.

According to an embodiment of the present invention, the phase comparator is capable of delivering a sixth binary signal in the third state when, the second signal having a phase lead over the first signal, the second signal is in the first state, the first signal being in the second state, and of providing the sixth signal substantially in the fourth state otherwise.

According to an embodiment of the present invention, the unit comprises a fourth current source capable of providing a seventh constant current IDOWN and the connection circuit is capable of connecting the second, third, and fourth current sources to the capacitor, to charge the capacitor with a sixth current equal to IUP−N*ID when the fifth signal is in the fourth state, equal to −IDOWN−N*ID when the sixth signal is in the third state and the fifth signal is in the third state and the sixth signal is in the fourth state, and equal to −N*ID when the fifth and sixth signals are simultaneously in the fourth state.

According to an embodiment of the present invention, the connection circuit comprises: a first P-channel MOS transistor having its source connected to the second current source and having its gate receiving the fifth signal; a second P-channel MOS transistor having its source connected to the second current source and having its gate receiving the complementary of the fifth signal; a third N-channel MOS transistor having its source connected to the fourth current source and having its gate receiving the sixth signal, the drains of the first and third MOS transistors being connected to the capacitor; a fourth N-channel MOS transistor having its source connected to the fourth current source and having its gate receiving the complementary of the sixth signal, the drain of the third transistor being connected to the drain of the fourth transistor; M assemblies, each assembly being connected to the capacitor and comprising in series the fifth current source and a fifth N-channel MOS transistor having its gate controlled by one of the bits of the third signal.

According to an embodiment of the present invention, the interpolator further comprises: a circuit for delivering seventh clock signals at the oscillation frequency and phase-shifted with respect to one another; and a multiplexer receiving the seventh signals and an eighth signal and capable of delivering the first signal equal to one of the seventh signals according to the eighth signal.

At least one embodiment of the present invention also provides a digital frequency synthesizer comprising a phase interpolator.

At least one embodiment of the present invention also provides an integrated electronic circuit comprising a frequency synthesizer.

At least one embodiment of the present invention also provides an electronic equipment comprising at least such an integrated circuit.

The foregoing objects, features, and advantages of the present invention will be discussed in detail in the following non-limiting description of specific embodiments in connection with the accompanying drawings.

DETAILED DESCRIPTION

For clarity, the same elements have been designated with the same reference numerals in the different drawings.

Figure 1:
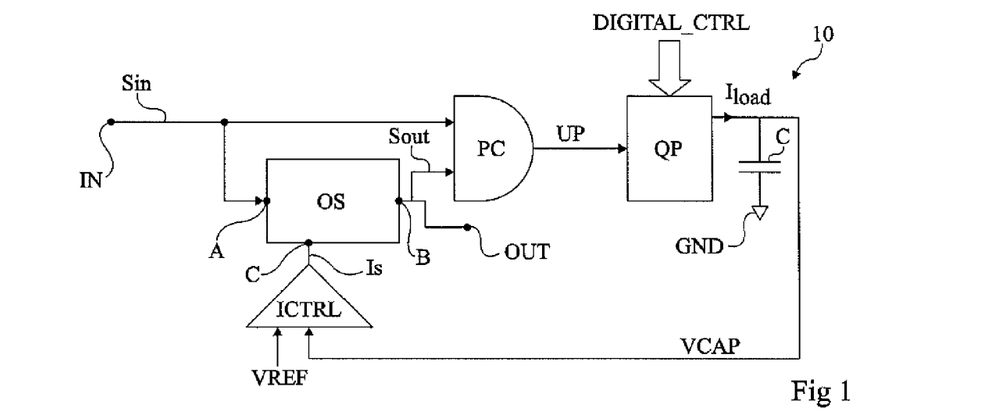
FIG. 1 is a symbolic diagram of an embodiment according to the present invention of a phase interpolator.

FIG. 1 shows an embodiment according to the present invention of a phase interpolator 10. Phase interpolator 10 comprises an input IN receiving a synchronization signal Sin, of frequency Fin, and an output OUT delivering an output signal Sout of frequency Fout equal to Fin and phase-shifted with respect to signal Sin by a phase shift $\Delta\phi$. As an example, signals Sin and Sout are square binary signals.

Phase interpolator 10 comprises a variable phase-shifter circuit OS comprising an input A receiving signal Sin, an output B delivering signal Sout, and a control terminal C receiving a control signal Is. Interpolator 10 further comprises a phase comparator PC receiving signals Sin and Sout and delivering a two-state signal UP to a charge pump QP. Charge pump QP further receives a digital control signal DIGITAL_CTRL and comprises an output connected to a terminal of a capacitor C having its other terminal connected to a source of a low reference voltage, for example, ground GND. Charge pump QP charges capacitor C with a current $I_{load}$. Voltage VCAP corresponds to the voltage across capacitor C. Voltage VCAP is provided to an input of a unit ICTRL which further receives a voltage reference VREF. Unit ICTRL provides control signal Is to control terminal C of variable phase-shifter circuit OS. As an example, control signal Is corresponds to a current.

According to the present embodiment, variable phase-shifter circuit OS comprises a synchronized oscillator. Generally, an oscillator is a circuit which comprises self-oscillating means and an output for providing an oscillating signal Sout of frequency Fout. An oscillator is characterized by a free oscillation frequency or natural frequency, noted Fo, which normally is the frequency of the oscillating signal. Oscillators however have the property of copying frequency Fin of a disturbance signal if said frequency is close to free oscillation frequency Fo of the oscillator. Such oscillators are called synchronized oscillators and are characterized by a synchronization range having a width which depends on the amplitude of the noise signal and on the structure of the oscillator.

Figure 2:
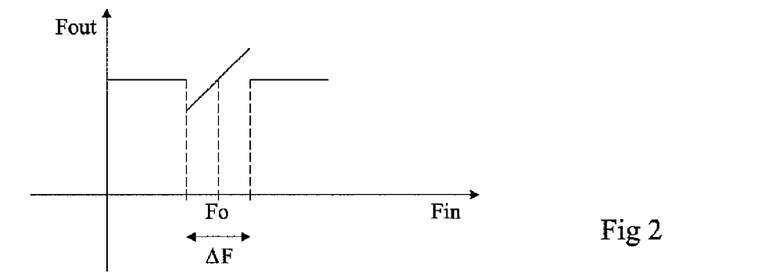
FIG. 2 is a graph illustrating the variation of the frequency of the output signal versus the frequency of the input signal of a synchronized oscillator.

FIG. 2 schematically shows an example of the variation of frequency Fout of output signal Sout according to frequency Fin of input signal Sin of a synchronized oscillator. As appears in this drawing, frequency Fout is equal to frequency Fo for the values of Fin located outside of synchronization range $\Delta F$, the synchronization range being centered on value Fo. For the values of Fin located inside of synchronization range $\Delta F$, the value of Fout is equal to Fin. Phase difference $\Delta\phi$ between synchronization signal Sin and output signal Sout only depends on difference Fin–Fo.

In conventional applications of synchronized oscillators, the input value is frequency Fin of synchronization signal Sin. For a phase interpolator using a synchronized oscillator, the input value is fixed and the free oscillation frequency Fo of the oscillator is varied as in a controlled oscillator. For the oscillator to remain synchronized, the variation of frequency Fo is limited so that frequency Fin remains within the resulting synchronization range $\Delta F$. Frequency Fout remains equal to Fin and phase shift $\Delta\phi$ of output signal Sout of the oscillator with respect to synchronization signal Sin is controlled. In other words, a variable phase-shifter circuit OS comprising a synchronized oscillator and a control input C receiving a control signal Is, which has the function of varying phase shift $\Delta\phi$ between output signal Sout and input signal Sin of the synchronized oscillator by varying the free oscillation frequency Fo of this oscillator, is obtained.

According to the present embodiment, interpolator 10 comprises a feedback loop enabling to modify the control signal Is of variable phase-shifter circuit OS. More specifically, signal UP provided by phase comparator PC is representative of the phase difference between signals Sout and Sin. Based on signal UP and on digital signal DIGITAL_CTRL, charge pump QP more or less charges or discharges capacitor C. Unit ICTRL delivers control signal Is of circuit OS based on voltage VCAP. At equilibrium, the phase-shift provided by circuit OS settles at a value which depends on digital signal DIGITAL_CTRL.

Figure 3:
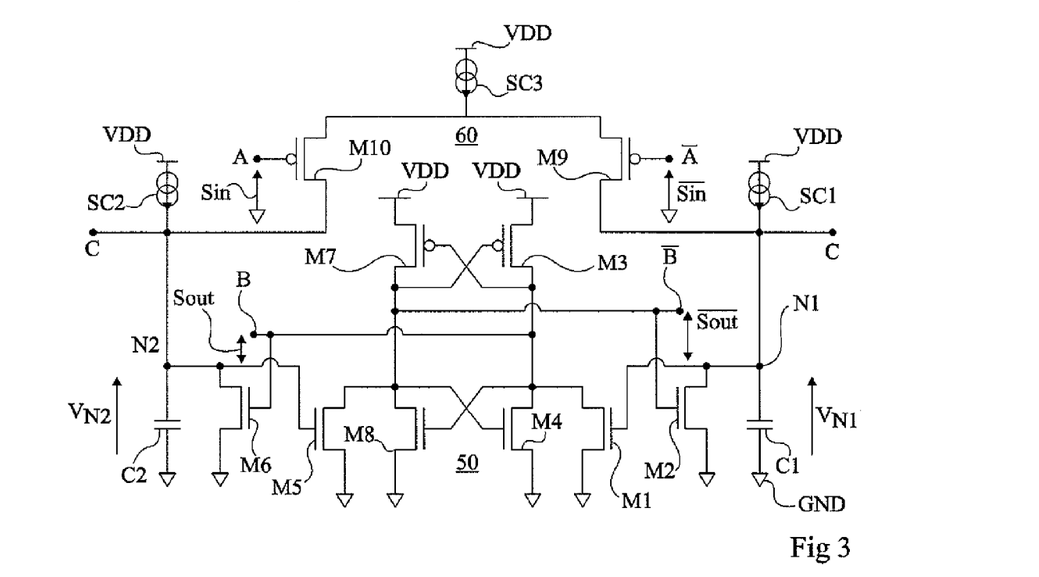
FIG. 3 is a detailed diagram of an embodiment of a variable phase-shifter circuit of the phase interpolator of FIG. 1.

FIG. 3 shows an embodiment of variable phase-shifter circuit OS.

Circuit OS comprises an oscillator 50 which generates an oscillating signal having a determined free oscillation frequency Fo as well as synchronization means 60 for receiving synchronization signal Sin having its frequency Fin ranging within synchronization range $\Delta F$ of the oscillator, which is especially determined by free oscillation frequency Fo.

In the present embodiment, oscillator 50 corresponds to an astable multivibrator. Multivibrator circuit 50 comprises a first current source SC1 having a terminal connected to a first source VDD of a high reference voltage and having its other terminal connected to a node N1. Node N1 is connected to a terminal of a capacitor C1 having its other terminal connected to a source of a low reference voltage, for example, ground GND. Node N1 is connected to the gate of an N-channel MOS transistor M1 having its source connected to ground GND. Node N1 is further connected to the drain of an N-channel MOS transistor M2 having its source connected to ground GND. Circuit 50 further comprises a P-channel MOS transistor M3 having its source connected to node B. Node B is further connected to the drain of a MOS transistor M4 and to the drain of transistor M1. The source of transistor M4 is connected to ground GND.

Symmetrically, circuit 50 comprises a current source SC2 having a terminal connected to voltage source VDD and having its other terminal connected to a node N2. Node N2 is connected to a terminal of a capacitor C2 having its other terminal connected to ground GND. Node N2 is connected to the gate of an N-channel MOS transistor M5, identical to transistor M1, having its source connected to ground GND. Node N2 is further connected to the drain of an N-channel MOS transistor M6, identical to transistor M2, having its source connected to ground GND and having its gate connected to node B. Circuit 50 further comprises a P-channel MOS transistor M7, identical to transistor M3, having its source connected to voltage source VDD and having its drain connected to node $\overline{B}$. Node $\overline{B}$ is further connected to the drain of an N-channel MOS transistor M8, identical to transistor M4, to the drain of transistor M5, and to the gate of transistor M4. The source of transistor M8 is connected to ground GND and the gate of transistor M8 is connected to node B. The gate of transistor M2 and the gate of transistor M6 are respectively connected to node $\overline{B}$ and to node B. The sources of currents SC1 and SC2 deliver a constant current Io. They may comprise current mirrors based on MOS transistors. Capacitors C1 and C2 have a capacitance Co. Output B, which provides signal Sout, corresponds to the gate of transistor M6. Signal Sout corresponds to the gate-source voltage of transistor M6. An output $\overline{B}$ delivering the complementary of signal Sout, noted $\overline{Sout}$, corresponds to the gate of transistor M2. Signal $\overline{Sout}$ corresponds to the gate-source voltage of transistor M2. Call $V_{N1}$ the voltage between node N1 and ground GND and $V_{N2}$ the voltage between node N2 and ground GND.

Figure 4:
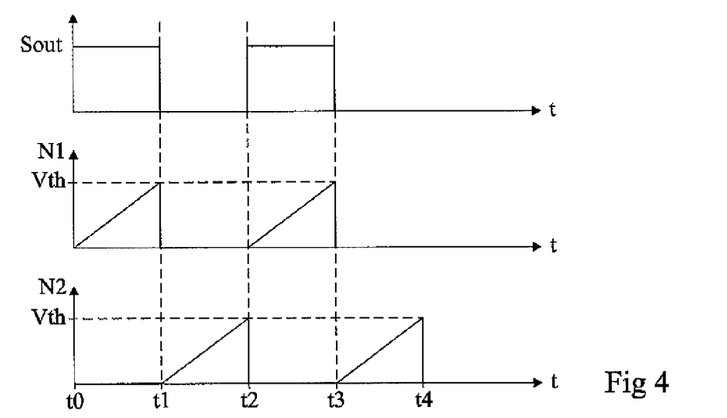
FIG. 4 is a timing diagram illustrating the operation of the circuit of FIG. 3.

FIG. 4 is a timing diagram of voltages Sout, $V_{N1}$, and $V_{N2}$ illustrating the operating principle of multivibrator circuit 50. Call t0, t1, t2, t3, and t4 successive times. The operation of multivibrator circuit 50 is cyclic. A cycle starts, for example, at time t0, when signal Sout is high and signal $\overline{Sout}$ is low. Transistor M2 is then off and transistor M6 is on. Voltage $V_{N2}$ is substantially zero and transistor M5 is off. Transistor M7 is off and transistor M3 is on. Voltage $V_{N1}$ is initially zero. The fact for transistor M2 to be off results in a rise of voltage $V_{N1}$ due to the charging of capacitor C1 by current source SC1 until voltage $V_{N1}$ exceeds threshold voltage Vth of transistor M1 at time t1. Transistor M1 then turns on, which switches voltage Sout to the low state, and causes the turning-off of transistor M6 and the switching to the high state of voltage $\overline{Sout}$. Since transistor M2 turns on, voltage $V_{N1}$ substantially drops to zero. Transistor M6 being in the off state, voltage $V_{N2}$ rises due to the charging of capacitor C2 by current source SC2 until it exceeds, at time t2, threshold voltage Vth of transistor M5 which then turns on, thus causing the switching to the low state of signal $\overline{Sout}$, the turning-off of transistor M2, and the switching to the high state of signal Sout.

Frequency Fo of multivibrator circuit 50 is provided by the following equation:

$$Fo = \frac{Io}{2 \cdot Co \cdot Vth} \quad (1)$$

As an example, the MOS transistors are obtained by a CMOS process for which the channel length of the MOS transistors is 65 nm, current Io is on the order of 100 µA, capacitance Co is on the order of 200 fF, and threshold voltage Vth is on the order of 0.5 V. The obtained frequency Fo then is on the order of 500 MHz.

Synchronization circuit 60 is formed of a current source SC3, delivering a constant current Isync, having one terminal connected to voltage source VDD and having its other terminal connected to the sources of P-channel MOS transistors M9 and M10. The drain of transistor M9 is connected to node N1 and the drain of transistor M10 is connected to node N2. Input A receiving voltage Sin is connected to the gate of transistor M10. The gate of transistor M9 is connected to an input $\overline{A}$ receiving the complementary of signal Sin, noted $\overline{Sin}$. Synchronization current Isync may be on the order of 50 µA.

When signal Sin is low, capacitor C2 is charged with current Io+Isync. When signal Sin is high, capacitor C2 is only charged by current Io. If the frequency of signal Sin is within the synchronization range of circuit 50, the oscillator is off and frequency Fout of output signal Sout is equal to frequency Fin. If frequency Fin is constant, then the phase difference between output signal Sout and signal Sin only depends on frequency Fo, that is, on current Io. Thereby, the control of phase-shift $\Delta\phi$ between signals Sout and Sin is obtained by adding to current Io the variable current Is provided to control terminal C connected to nodes N1 and N2. Frequency Fo is then provided by the following relation:

$$Fo = \frac{Io + Is}{2 \cdot Co \cdot Vth} \quad (2)$$

An advantage of variable phase-shifter circuit OS of FIG. 3 is that the phase noise of output signal Sout is a copy of the phase noise of injected signal Sin. Another advantage is that the consumption is low. Indeed, supply voltage VDD must only be greater than threshold voltage Vth of transistors M2 and M6 to which is added a voltage necessary for the P-channel transistors forming current mirrors delivering current Io to operate in saturation mode. Further, since capacitors C1 and C2 are alternately charged, maximum current Icmax of circuit OS is equal to Io+Is+Isync. The value of Icmax to be provided is a function of the surface area of capacitors C1 and C2 and of the oscillator frequency. Further, since variable phase-shifter circuit OS is based on MOS transistors, it can easily be made in integrated form.

Figure 5:
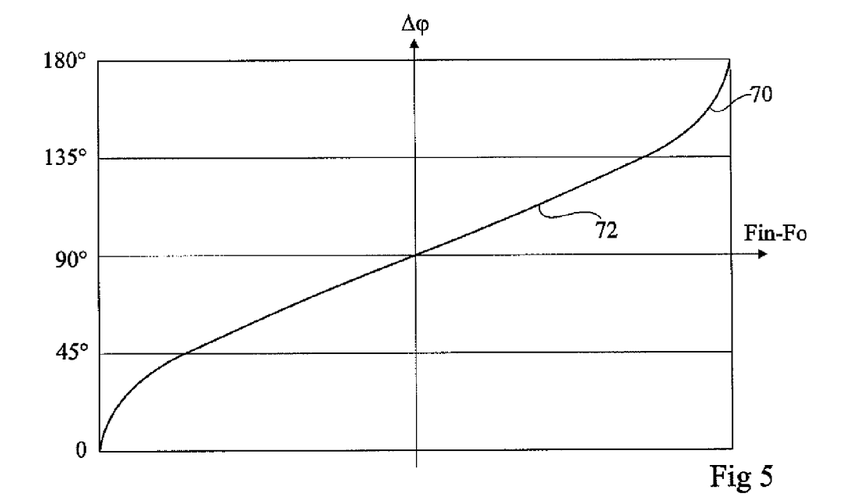
FIG. 5 is a graph illustrating the phase shift of the output signal with respect to the input signal of the phase-shifter circuit of FIG. 3, according to the difference between the frequency of the input signal and the free oscillation frequency of the phase-shifter circuit.

FIG. 5 shows variation curve 70 of phase-shift Δφ obtained by circuit OS of FIG. 3 according to difference Fin−Fo. When Fin is equal to Fo, phase-shift Δφ is equal to 90° (modulo 180)°. It should be noted that curve 70 comprises a quasi-linear portion 72. Quasi-linear portion 72 corresponds, for circuit OS of FIG. 3, to phase shifts substantially ranging between Δφ1=45° and Δφ2=135°.

Figure 6:
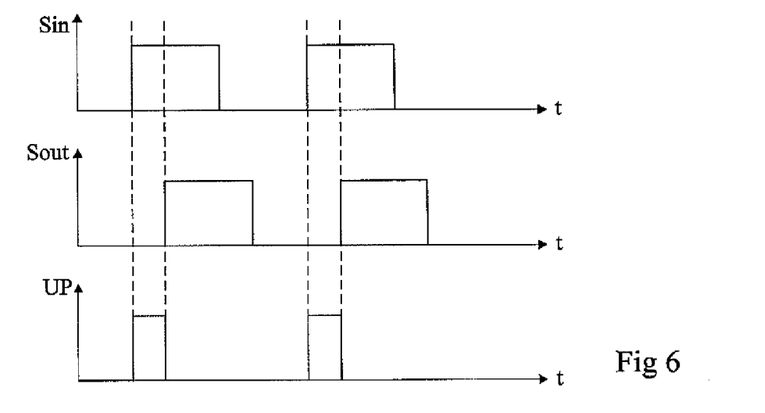
FIG. 6 is a timing diagram illustrating the operating principle of a phase comparator of the phase interpolator of FIG. 1.

FIG. 6 is a timing diagram illustrating the operating principle of phase comparator PC. Phase comparator PC provides signal UP in the high state when signal Sin is in the high state while signal Sout is in the low state and provides signal UP in the low state in all other cases, that is, when signal Sin is in the high state while signal Sout is in the high state, when signal Sin is in the low state while signal Sout is in the high state or when signals Sin and Sout are simultaneously in the low state. Call DC the duty cycle of signal UP. Phase-shift Δφ between signals Sout and Sin is provided by the following relation:

$$\Delta\phi = 360 \cdot DC \quad (3)$$

Figure 7:
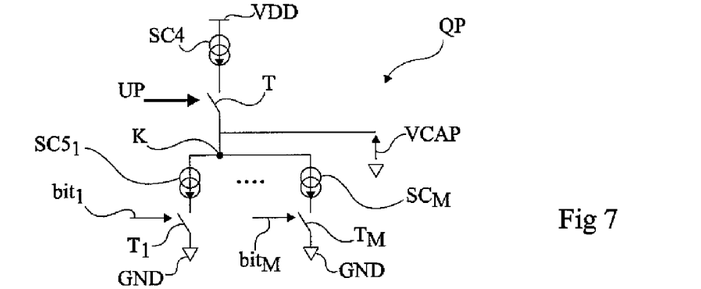
FIG. 7 is a detailed diagram of an embodiment of a charge pump of the phase interpolator of FIG. 1.

FIG. 7 schematically shows an embodiment of charge pump QP. Charge pump QP receives digital signal DIGITAL_CTRL coded over a number M of bits. The bit at position i of signal DIGITAL_CTRL is noted $bit_i$, where i is an integer varying from 1 to M. Charge pump QP comprises a current source SC4 having a terminal connected to voltage source VDD and having its other terminal connected to a terminal of a switch T. The other terminal of switch T is connected to a node K intended to be connected to a terminal of capacitor C (not shown in FIG. 7). Voltage VCAP substantially corresponds to the voltage between node K and ground GND. Switch T is controlled by signal UP. As an example, transistor T is on when signal UP is high and is off when signal UP is low. Switch T may be formed by one or several MOS transistors. Current source SC4 provides a constant current IUP.

Charge pump QP comprises M current sources $SC5_i$, where i is an integer varying between 1 and M. Each current source $SC5_i$ is capable of providing a constant current ID. Each source $SC5_i$ has a first terminal connected to node K and a second terminal connected to a terminal of a switch $T_i$. The other terminal of switch $T_i$ is connected to ground GND. Switch $T_i$ is controlled by bit $bit_i$. As an example, transistor $T_i$ is on when bit $bit_i$ is high (at "1") and is off when bit $bit_i$ is low (at "0"). Each switch $T_i$ may be formed by one or several MOS transistors.

The operation of phase interpolator 100 is the following. As an example, it is assumed that, out of the M bits of signal DIGITAL_CTRL, there is a number N of bits in the high state. When signal UP is in the high state, capacitor C is charged by a current equal to IUP−N×ID. When signal UP is low, capacitor C is discharged by a current equal to N×ID.

The loop forming phase interpolator 100 reaches a convergence point when the following relation is verified:

$$DC \cdot IUP = N \cdot ID \quad (4)$$

Phase-shift Δφ is provided by the following relation:

$$\Delta\varphi = 360 \cdot \frac{N \cdot ID}{IUP} \quad (5)$$

As appears on curve 70 of FIG. 5, the variation of phase-shift Δφ is substantially linear, at least between 45° and 135° modulo 180 degrees. Unit ICTRL delivers a control current Is which depends on voltage VCAP across capacitor C. Call I1 the current for which phase-shift Δφ1 is 45° and I2 the current for which phase-shift Δφ2 is 135°.

By selecting currents ID and IUP, and by varying number N, it is thus possible to control unit ICTRL so that it delivers a current ranging between I1 and I2 and thus to obtain an interpolation between phase-shifts Δφ1 and Δφ2. This enables to obtain a particularly simple phase-shift control since phase shift Δφ applied by oscillator OS then varies linearly according to control current Is. As an example, capacitances C is on the order of 4 pF, ID is on the order of 5/12 μA, IUP is on the order of 10 μA and N varies between 3 and 9.

Figure 8:
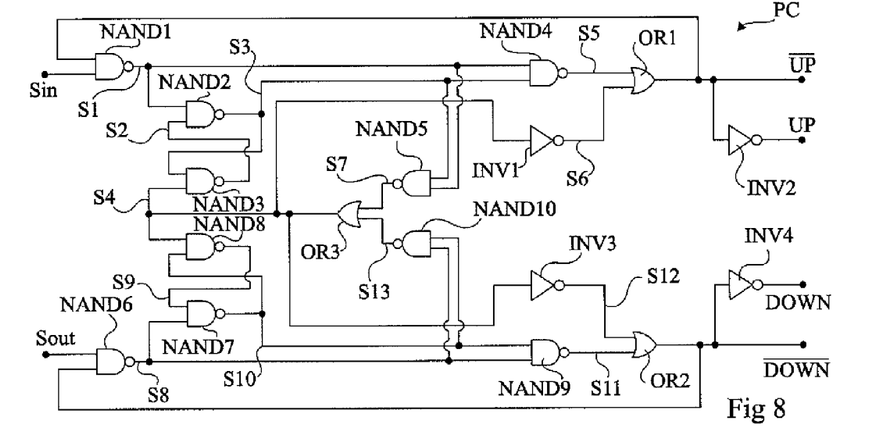
FIG. 8 is a detailed diagram of an embodiment of a phase comparator of the phase interpolator of FIG. 1.
Figure 9:
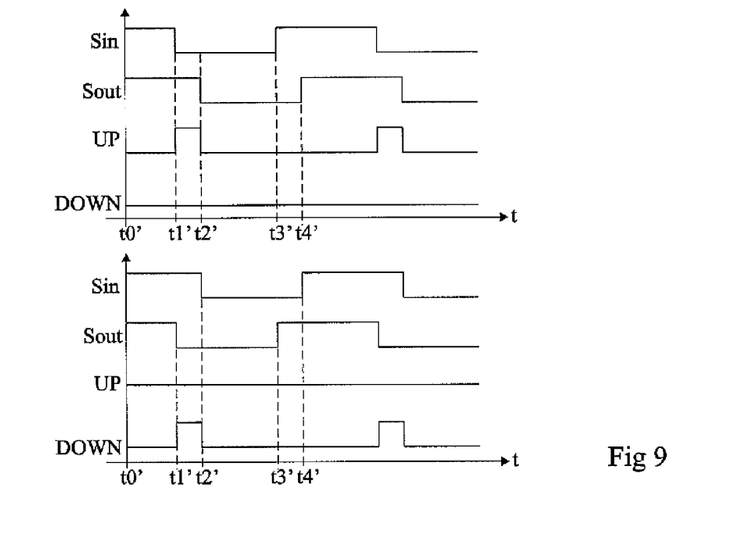
FIG. 9 is a timing diagram of input and output signals of the phase comparator of FIG. 8.
Figure 10:
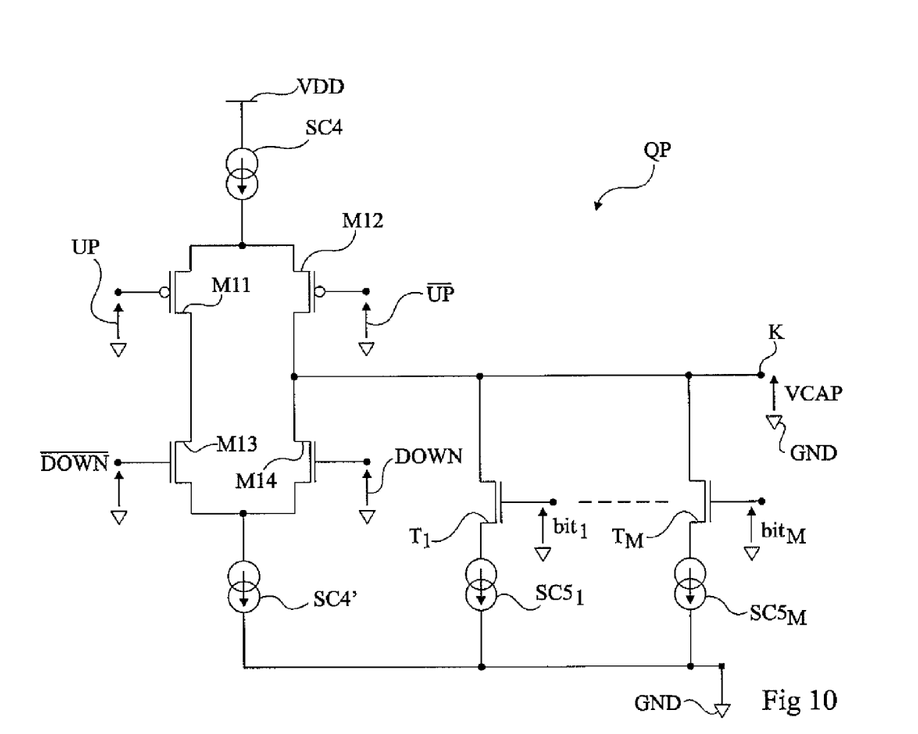
FIG. 10 is a detailed diagram of another embodiment of a charge pump of the phase interpolator of FIG. 1.

The examples of phase comparator PC and of charge pump QP previously described in relation with FIGS. 6 and 7 are adapted to the case where signal Sin has a phase lead over signal Sout, which is always true when the loop forming interpolator 10 is at equilibrium. However, at the locking of the loop, signal Sout may temporarily have a phase lead over signal Sin. FIGS. 8 to 10 illustrate embodiments of phase comparator PC and of charge pump QP adapted to the case where signal Sout may have a phase lead over signal Sin.

FIG. 8 is an electric diagram of an embodiment of phase comparator PC in which phase comparator PC delivers, in addition to signal UP, a signal $\overline{UP}$ which is the complementary of signal UP, a two-state signal DOWN and a signal $\overline{DOWN}$ which is the complementary of signal DOWN.

Phase comparator PC comprises a NAND-type logic gate NAND1 receiving signal Sin and signal $\overline{UP}$ and delivering a signal S1. A NAND-type logic gate NAND2 receives signal S1 and a signal S2 and delivers a signal S3. A NAND-type logic gate NAND3 receives signal S3 and a signal S4 and delivers signal S2. A NAND-type logic gate NAND4 receives signals S1 and S3 and delivers a signal S5. An inverter INV1 receives signal S4 and delivers a signal S6. An OR-type logic gate OR1 receives signals S5 and S6 and delivers signal $\overline{UP}$. An inverter INV2 receives signal $\overline{UP}$ and delivers signal UP. A NAND-type logic gate NAND5 receives signals S1 and S3 and delivers a signal S7. A NAND-type logic gate NAND6 receives signal Sout and signal $\overline{DOWN}$ and delivers a signal S8. A NAND-type logic gate NAND7 receives signals S8 and S9 and delivers a signal S10. A NAND-type logic gate NAND8 receives signals S10 and S4 and delivers signal S9. A NAND-type logic gate NAND9 receives signals S8 and S10 and delivers a signal S11. An inverter INV3 receives signal S4 and delivers a signal S12. An OR-type logic gate OR2 receives signals S11 and S12 and delivers signal $\overline{DOWN}$. An inverter INV4 receives signal $\overline{DOWN}$ and delivers signal DOWN. A NAND-type logic gate NAND10 receives signals S8 and S10 and delivers a signal S13. An OR-type logic gate OR3 receives signals S7 and S13 and delivers signal S4.

FIG. 9 shows timing diagrams of signals Sin, Sout, UP and DOWN illustrating the operation of phase comparator PC of FIG. 8. Call t0' to t4' successive times. As an example, initially, signals Sin and Sout are high and signals UP and DOWN are low.

In the top timing diagram of FIG. 9, at time t1', signal Sin switches to the low state, signal Sout remaining high, which means that signal Sin has a phase lead over Sout. This results in the switching of signal UP from the low state to the high state, with signal DOWN remaining in the low state. At time t2', signal Sout switches to the low state. This results in the switching of signal UP, from the high state to the low state. At time t2', signals UP and DOWN are both high during the response time of the logic gates, after which they switch back to the low state, without modifying the information about the phase lead of signal Sin over signal Sout contained in signal UP, so that it can be considered that signal UP instantaneously switches from the high state to the low state at time t2' and that signal DOWN remains substantially permanently in the low state. At time t3', signal Sin switches from the low state to the high state. Signals UP and DOWN remain in the low state. At time t4', signal Sout switches from the low state to the high state. Signals UP and DOWN remain low. The duty cycle of signal UP is thus identical to what has been previously described in relation with FIG. 6.

In the bottom timing diagram of FIG. 9, at time t1', signal Sout switches from the high state to the low state, with signal Sin remaining high, which means that signal Sout has a phase lead over Sin. This results in the switching of signal DOWN from the low state to the high state, with signal UP remaining low. At time t2', signal Sin switches from the high state to the low state. This results in the switching of signal DOWN from the high state to the low state. At time t2', signals UP and DOWN are both in the high state during the response time of the logic gates, then switch back to the low state, without modifying the information about the phase lead of signal Sout over signal Sin contained in signal DOWN, so that it can be considered that signal DOWN instantaneously switches from the high state to the low state at time t2' and that signal UP remains substantially permanently in the low state. At time t3', signal Sout switches form the low state to the high state. Signal UP and DOWN remain in the low state. At time t4', signal Sin switches from the low state to the high state. Signals UP and DOWN remain in the low state.

FIG. 10 shows another embodiment of charge pump QP adapted to phase comparator PC of FIG. 8. The elements common with the embodiment of charge pump QP of FIG. 7 are designated with the same references. Each switch $T_1$ to $T_M$ corresponds to an N-channel MOS transistor having its drain connected to node K and having its source connected to a terminal of current source $SC5_i$, the other terminal of current source $SC5_i$ being connected to ground GND. Switch T of charge pump QP of FIG. 7 is replaced with four MOS transistors M11, M12, M13, and M14. Transistor M11 is a P-channel MOS transistor having its gate receiving signal UP. Transistor M12 is a P-channel MOS transistor having its gate receiving signal $\overline{UP}$. The sources of transistors M11 and M12 are connected to a terminal of current source SC4. Transistor M13 is an N-channel MOS transistor having its gate receiving signal $\overline{DOWN}$. Transistor M14 is an N-channel MOS transistor having its gate receiving signal DOWN. The drain of transistor M11 is connected to the drain of transistor M13 and the drain of transistor M12 is connected to the drain of transistor M14. The sources of transistors M13 and M14 are connected to a terminal of a current source SC4'. The other terminal of current source SC4' is connected to ground GND. Current source SC4' provides current IDOWN equal to current IUP.

When signal UP is high and signal DOWN is low, that is when signal Sin has a phase lead over signal Sout, transistors M11 and M14 are in the off state and transistors M12 and M13 are on. Capacitor C, connected to terminal K, is then charged with a current equal to IUP−N×ID, N being the number of bits of signal DIGITAL_CTRL in the high state. When signal UP is low and signal DOWN is low, that is, when signal Sout has a phase lead over signal Sin, transistors M11 and M14 are on and transistors M12 and M13 are off, capacitor C is then discharged by a current equal to −IDOWN−N×ID. When signals UP and DOWN are simultaneously high, transistors M11 and M13 are off and transistors M12 and M14 are on. The currents provided by current sources SC4 and SC4' run from source VDD to ground GND without running through capacitor C. Similarly, when signals UP and DOWN are simultaneously low, transistors M11 and M13 are on and transistors M12 and M14 are off. The currents provided by current sources SC4 and SC4' run from source VDD to ground GND without running through capacitor C. In these last two cases, capacitor C is discharged by a current equal to N×ID.

Figure 11:
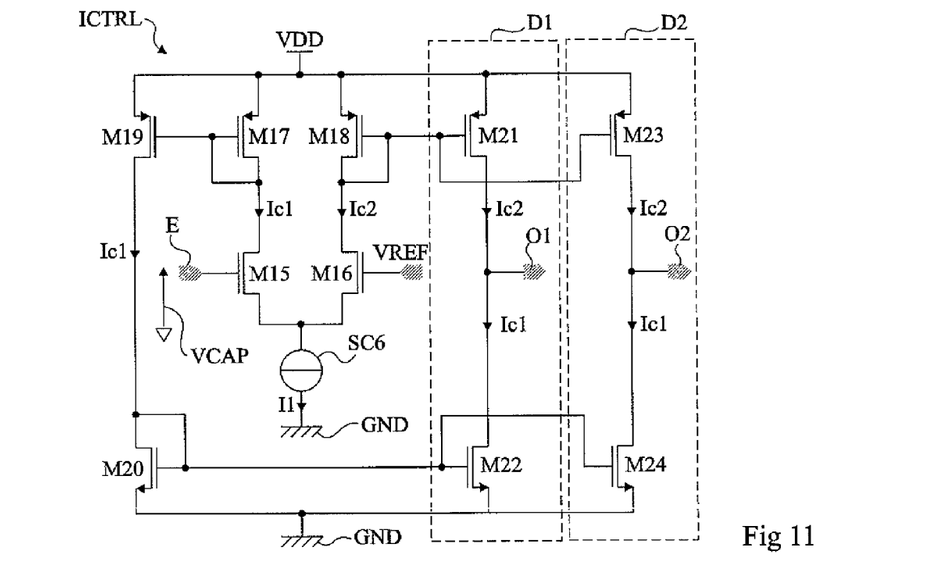
FIG. 11 is a detailed diagram of an embodiment of a transconductance circuit of the phase interpolator of FIG. 1.

FIG. 11 shows an embodiment of unit ICTRL. Unit ICTRL is a transconductance comprising an input E receiving voltage VCAP and two outputs O1 and O2. Output O1 is connected to node N1 of phase-shifter circuit OS and output O2 is connected to node N2 of phase-shifter circuit OS. Unit ICTRL comprises a differential pair having an N-channel MOS transistor M15 and an N-channel MOS transistor M16. The gate of transistor M15 is connected to input E. The gate of transistor M16 receives reference voltage VREF. The sources of transistors M15 and M16 are connected to ground GND through a current source SC6. Current source SC6 delivers a constant current I1. The drain of transistor M15 is connected to the drain of a diode-assembled P-channel MOS transistor M17 having its source connected to voltage source VDD. The drain of transistor M16 is connected to the drain of a diode-assembled P-channel MOS transistor M18 having its source connected to voltage source VDD. Transistor M17 is assembled as a current mirror with a P-channel MOS transistor M19 and an N-channel MOS transistor M20. The gate and the drain of transistor M17 are connected to the gate of transistor M19. The source of transistor M19 is connected voltage source VDD and the drain of transistor M19 is connected to the drain and to the gate of transistor M20. The source of transistor M20 is connected to ground GND.

Unit ICTRL further comprises two output stages D1 and D2 of similar structure. Output stage D1 comprises a P-channel MOS transistor M21 having its source connected to voltage source VDD, having its gate connected to the gate of transistor M18 and having its drain connected to output terminal O1. Stage D1 further comprises an N-channel MOS transistor M22 having its drain connected to output terminal O1, having its source connected to ground GND, and having its gate connected to the gate of transistor M20. Output stage D2 comprises a P-channel MOS transistor M23 having its source connected to voltage source VDD, having its gate connected to the gate of transistor M18 and having its drain connected to output terminal O2. Stage D2 further comprises an N-channel MOS transistor M24 having its drain connected to output terminal O2, having its source connected to ground GND, and having its gate connected to the gate of transistor M20.

The operation of unit ICTRL is the following. According to the difference between voltages VCAP and VREF, applied on the respective gates of transistors M15 and M16 of the differential pair, currents Ic1 and Ic2 establish in the two branches of said differential pair, while respecting equality Ic1+Ic2=I1. Transistors M17, M19, M20, M22, and M24 being assembled as current mirrors, current Ic1 can be found at the drains of transistors M22 and M24. Similarly, transistors M18, M21, and M23 being assembled as current mirrors, one can find current Ic2 at the drains of transistors M21 and M23. Accordingly, outputs O1 and O2 deliver a current which corresponds to the difference between currents Ic1 and Ic2, which depends on the difference between voltages VCAP and VREF.

Figure 12:
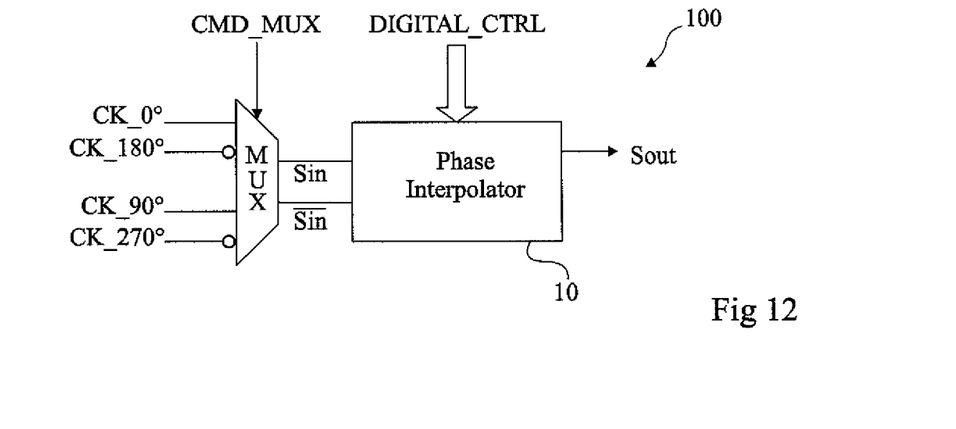
FIG. 12 shows a symbolic diagram of another embodiment according to the present invention of a phase interpolator.

FIG. 12 shows another embodiment of a phase interpolator 100 according to the present invention enabling to create a phase shift Δϕ between signals Sin and Sout varying from 0° to 360° while operating variable phase-shifter circuit OS in the linear phase-shift range. Phase interpolator 100 comprises previously-described phase interpolator 10 and further comprises a multiplexer MUX providing signals Sin and $\overline{Sin}$ to phase interpolator 10 and receiving four signals:

a square signal CK_0° of frequency Fin;

the complementary of signal CK_0°, noted CK_180°, which thus corresponds to a square signal of frequency Fin phase-shifted by 180° with respect to signal CK_0°;

a signal CK_90° which corresponds to a square signal of frequency Fin phase-shifted by 90° with respect to signal CK_0°; and the complementary of signal CK_90°, noted CK_270°, which thus corresponds to a square signal of frequency Fin phase-shifted by 270° with respect to signal CK_0°.

Signals CK_0°, CK_90°, CK_180°, and CK_270° may be provided by a clock generator comprising, for example, a delay locked loop DLL, or by a clock of good duty cycle and having a frequency which is twice that of the interpolator operation and a frequency divider.

Multiplexer MUX receives a control signal CMD_MUX and provides, according to control signal CMD_MUX, signal Sin equal to one of signals CK_0°, CK_90°, CK_180°, and CK_270° and signal $\overline{Sin}$ corresponding to the complementary of signal Sin.

Figure 13:
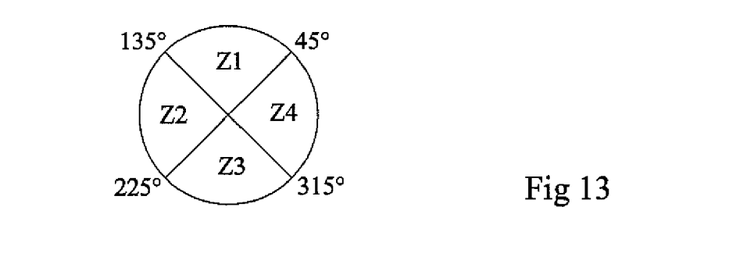
FIG. 13 is a diagram illustrating the operation of the circuit of FIG. 12.

FIG. 13 illustrates the operating principle of phase interpolator 100 of FIG. 12. The phase interpolation range from 0° to 360° is divided into four areas Z1 to Z4 respectively corresponding to phase-shifts from 45° to 135°, from 135° to 225°, from 225° to 315°, and from 315° to 45° (modulo 360°).

When a phase interpolation ranging between 45° and 135° must be performed, which corresponds to area Z1, control signal CMD_MUX controls multiplexer MUX so that signal Sin is equal to signal CK_0°. When a phase interpolation ranging between 135° and 225° must be performed, which corresponds to area Z2, signal CMD_MUX controls multiplexer MUX so that signal Sin is equal to signal CK_90°. This signal being already phase-shifted by 90° with respect to signal CK_0°, an additional shift ranging between 45° and 135° applied to signal CK_90° by phase-shifter circuit OS is equivalent to a phase shift ranging between 135° and 225° applied to signal CK_0°. When a phase interpolation ranging between 225° and 135° must be performed, which corresponds to area Z3, signal CMD_MUX controls multiplexer MUX so that signal Sin is equal to signal CK_180°. This signal being already phase-shifted by 180° with respect to signal CK_0°, an additional phase shift ranging between 45° and 135° applied to signal CK_180° by phase-shifter circuit OS is equivalent to a phase shift ranging between 225° and 315° applied to signal CK_0°. When a phase interpolation ranging between 315° and 45° (modulo 360°) must be performed, which corresponds to area Z4, signal CMD_MUX controls multiplexer MUX so that signal Sin is equal to signal CK_270°. This signal being already phase-shifted by 270° with respect to signal CK_0°, an additional phase shift ranging between 45° and 135° applied to signal CK_270° by phase-shifter circuit OS is equivalent to a phase shift ranging between 315° and 45° (modulo 360°) applied to signal CK_0°.

The previously-described embodiments of the phase interpolator advantageously enable to obtain a low noise since the phase noise is a copy of the noise of the injected signal.

Further, the architecture of the phase interpolator enables to perform a particularly simple digital control.

A phase interpolator is generally comprised in a frequency synthesizer. Such a synthesizer is generally integrated in a circuit with other functions, for example, a computer bus interface, a radio receive circuit, etc. Integrated circuits comprising one or several frequency synthesizers belong to electronic equipments, for example, computer hard disks, cell phones, etc.

Figure 14:
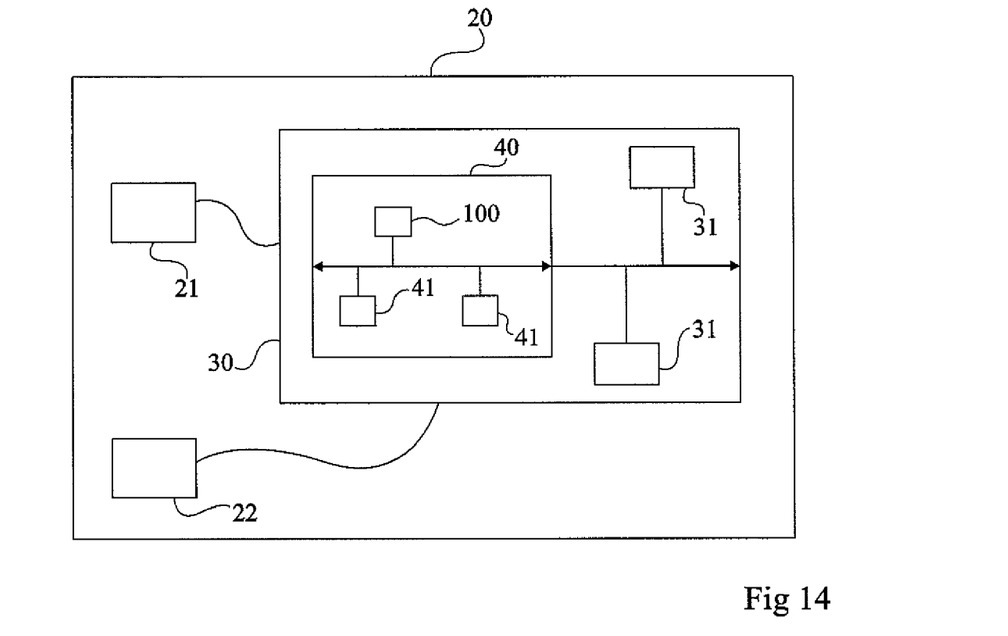
FIG. 14 shows in the form of blocks an electronic equipment comprising a phase interpolator.

FIG. 14 shows in the form of blocks an example of an electronic equipment 20 comprising, among other circuits 21 and devices 22, an integrated circuit 30 integrating, among other circuits 31, a frequency synthesizer 40 comprising a phase interpolator 100 and other circuits 41. Different arbitrary connections have been shown between the different elements.

Specific embodiments of the present invention have been described. Various alterations and modifications will occur to those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A phase interpolator receiving a first signal having an oscillation frequency and providing a second signal having said oscillation frequency and being phase-shifted with respect to the first signal which depends on a third signal, the interpolator comprising:

a variable phase-shifter circuit receiving the first signal and providing the second signal, the phase-shifter circuit comprising an astable multivibrator circuit having a first branch and a second branch arranged in parallel between first and second supply terminals, and means capable of providing, in each of the first and second branches, a first current controlled by a fourth signal (Is), the means comprising a first current source capable of providing a second constant current, and wherein the fourth signal is a third variable current which adds to the second current, which results in a variation of a free oscillation frequency (Fo);

a phase comparator capable of receiving the first and second signals and of providing a fifth signal representative of said phase shift; and a unit capable of providing the fourth signal, which depends on the third and fifth signals, wherein the phase comparator is capable of providing the fifth signal in the form of a binary signal having a duty cycle which depends on said phase shift, wherein the first and second signals are binary signals alternating between first and second states and wherein the phase comparator is capable of providing the fifth signal in a third state when, the first signal having a phase lead over the second signal, the first signal is in the first state, the second signal being in the second state, and of providing the fifth signal substantially in a fourth state otherwise.

2. The interpolator of claim 1, wherein the third signal is a digital signal coded over a number M of bits, a number N of said M bits being in a third state, and wherein the unit comprises:

a capacitor;

a second current source capable of delivering a fourth constant current IUP;

M third current sources, each third current source being capable of delivering a fifth constant current ID; and a connection circuit capable of connecting the second and third current sources to the capacitor to charge the capacitor with a sixth current equal to IUP−N*ID when the fifth signal is in the third state and, at least partly, equal to −N*ID when the fifth signal is in the fourth state.

3. The interpolator of claim 2, wherein the phase comparator is capable of delivering a sixth binary signal in the third state when, the second signal having a phase lead over the first signal, the second signal is in the first state, the first signal being in the second state, and of providing the sixth signal substantially in the fourth state otherwise.

4. The interpolator of claim 3, wherein the unit comprises a fourth current source capable of providing a seventh constant current and wherein the connection circuit is capable of connecting the second, third, and fourth current sources to the capacitor, to charge the capacitor with a sixth current equal to IUP−N*ID when the fifth signal is in the fourth state, equal to −IDOWN−N*ID when the sixth signal is in the third state and the fifth signal is in the third state and the sixth signal is in the fourth state, and equal to −N*ID when the fifth and sixth signals are simultaneously in the fourth state.

5. The interpolator of claim 4, wherein the connection circuit comprises:
a first P-channel MOS transistor having its source connected to the second current source and having its gate receiving the fifth signal;
a second P-channel MOS transistor having its source connected to the second current source and having its gate receiving the complementary of the fifth signal;
a third N-channel MOS transistor having its source connected to the fourth current source and having its gate receiving the sixth signal, the drains of the first and third MOS transistors being connected to the capacitor;
a fourth N-channel MOS transistor having its source connected to the fourth current source and having its gate receiving the complementary of the sixth signal, the drain of the third transistor being connected to the drain of the fourth transistor;
M assemblies, each assembly being connected to the capacitor and comprising in series the fifth current source and a fifth N-channel MOS transistor having its gate controlled by one of the bits of the third signal.

6. A digital frequency synthesizer comprising the phase interpolator of claim 1.

7. An integrated electronic circuit comprising the frequency synthesizer of claim 6.

8. An electronic equipment comprising at least one integrated circuit of claim 7.

9. A phase interpolator receiving a first signal having an oscillation frequency and providing a second signal having said oscillation frequency and being phase-shifted with respect to the first signal which depends on a third signal, the interpolator comprising:
a variable phase-shifter circuit receiving the first signal and providing the second signal, the phase-shifter circuit comprising an astable multivibrator circuit having a first branch and a second branch arranged in parallel between first and second supply terminals, and means capable of providing, in each of the first and second branches, a first current controlled by a fourth signal (Is), the means comprising a first current source capable of providing a second constant current, and wherein the fourth signal is a third variable current which adds to the second current, which results in a variation of a free oscillation frequency (Fo);
a phase comparator capable of receiving the first and second signals and of providing a fifth signal representative of said phase shift; and
a unit capable of providing the fourth signal, which depends on the third and fifth signals;
a circuit for delivering seventh clock signals at the oscillation frequency and phase-shifted with respect to one another; and
a multiplexer receiving the seventh signals and an eighth signal and capable of delivering the first signal equal to one of the seventh signals according to the eighth signal.

10. A digital frequency synthesizer comprising the phase interpolator of claim 9.

11. An integrated electronic circuit comprising the frequency synthesizer of claim 10.

12. An electronic equipment comprising at least one integrated circuit of claim 11.

13. A phase interpolator, comprising:
a controllable phase-shifter configured to receive an input signal and produce a phase-shifted signal;
a phase comparator configured to receive the input signal at a first input and the phase-shifted signal at a second input, and further configured to produce an output signal indicative of a phase difference between the input signal and the phase-shifted signal;
a controllable charge pump configured to receive at a first input the output signal of the phase comparator and further configured to receive at a second input a digital control signal; and
a control circuit coupled to an output of the controllable charge pump and to an input of the controllable phase-shifter and configured to provide a control signal to the controllable phase-shifter to adjust the phase difference, the control signal provided by the control circuit differing from the digital control signal.

14. The phase interpolator of claim 13, further comprising a capacitor coupled to the controllable charge pump and configured to be charged and discharged by the controllable charge pump.

15. The phase interpolator of claim 14, wherein the capacitor is further coupled to an input of the control circuit.

16. The phase interpolator of claim 15, wherein the control circuit is further configured to receive a reference signal, and wherein the control signal provided by the control circuit is based at least in part on a comparison of the reference signal to a voltage on the capacitor.

17. The phase interpolator of claim 13, wherein the control signal provided by the control circuit is a control current whose value is variable.

18. The phase interpolator of claim 13, wherein the digital control signal is coded over a number M of bits.

19. The phase interpolator of claim 18, wherein the controllable charge pump comprises M current sources, and wherein the digital control signal controls how many of the M current sources are in a conducting state.

20. The phase interpolator of claim 13, wherein the variable phase-shifter comprises a synchronized oscillator.

21. The phase interpolator of claim 13, wherein the controllable phase-shifter, the phase comparator, the controllable charge pump, and the control circuit form, at least in part, a feedback loop.

22. The phase interpolator of claim 13, wherein the output signal of the phase comparator is a two-state signal variable between two states.

23. The phase interpolator of claim 13, wherein the controllable phase-shifter comprises an astable multivibrator circuit.

24. The phase interpolator of claim 23, wherein the astable multivibrator circuit comprises a first branch and a second branch arranged in parallel, each of the first and second branches comprising a current source.

25. The phase interpolator of claim 13, wherein the controllable phase-shifter is configured to produce the phase-shifted signal having a phase error that is a copy of a phase error of the input signal.

26. The phase interpolator of claim 13, further comprising a capacitor coupled to the controllable charge pump and configured to be charged and discharged by the controllable charge pump, and wherein the controllable charge pump comprises a current source coupled to the capacitor by a switch, the switch being controlled by the output signal of the phase comparator.

27. The phase interpolator of claim 13, wherein the controllable charge pump comprises a plurality of current sources, and wherein the controllable phase-shifter is configured to adjust the phase difference in dependence on how many current sources of the plurality of current sources are in a conducting state.

28. A method, comprising:
receiving an input signal;
producing, from the input signal, a phase-shifted signal;
comparing a phase of the input signal to a phase of the phase-shifted signal;
producing, in response to comparing the phase of the input signal to the phase of the phase-shifted signal, a comparison signal indicative of a phase difference between the input signal and the phase-shifted signal;
providing the comparison signal to a charge pump;
providing a digital control signal to the charge pump;
producing, with a control circuit coupled to an output of the charge pump, a control signal differing from the digital control signal; and
adjusting the phase difference based on the control signal.

29. The method of claim 28, further comprising charging or discharging a capacitor coupled to the output of the charge pump.

30. The method of claim 29, wherein producing the control signal comprises comparing a voltage on the capacitor to a reference voltage.

31. The method of claim 28, wherein producing a control signal differing from the digital control signal comprises producing a variable control current.

32. The method of claim 28, wherein the digital control signal is coded over a number M of bits.

33. The method of claim 28, wherein the charge pump comprises M current sources, and wherein the method further comprises adjusting how many of the M current sources are in a conducting state in response to providing the digital control signal to the charge pump.

34. The method of claim 28, wherein the comparison signal is a two-state signal variable between two states.

35. The method of claim 28, wherein the input signal has a phase error, and wherein producing the phase-shifted signal comprises producing the phase shifted signal to have a phase error equal to the phase error of the input signal.

36. The method of claim 28, wherein the charge pump has a current source couplable to a capacitor, and wherein the method further comprises coupling the current source to the capacitor in response to the comparison signal.

37. The method of claim 28, wherein adjusting the phase difference comprises adjusting the phase difference by an amount dependent on a number of current sources of the charge pump that are in a conducting state.

38. The method of claim 28, wherein the digital control signal is coded over a number M of bits, and wherein the method comprises providing the digital control signal to a plurality of M current sources in the charge pump.

* * * * *